US009214313B2

(12) United States Patent
Matesa, Jr. et al.

(10) Patent No.: US 9,214,313 B2
(45) Date of Patent: Dec. 15, 2015

(54) ION SOURCE WITH INDEPENDENT POWER SUPPLIES

(75) Inventors: Joseph M. Matesa, Jr., Murrysville, PA (US); Paul E. Fischione, Export, PA (US)

(73) Assignee: E.A. Fischione Instruments, Inc., Export, PA (US)

( * ) Notice: Subject to any disclaimer, the term of this patent is extended or adjusted under 35 U.S.C. 154(b) by 85 days.

(21) Appl. No.: 13/082,983

(22) Filed: Apr. 8, 2011

(65) Prior Publication Data

US 2011/0248179 A1 Oct. 13, 2011

Related U.S. Application Data

(60) Provisional application No. 61/369,270, filed on Jul. 30, 2010, provisional application No. 61/322,547, filed on Apr. 9, 2010.

(51) Int. Cl.
*H01J 1/50* (2006.01)
*H01J 37/08* (2006.01)
(Continued)

(52) U.S. Cl.
CPC .............. *H01J 37/08* (2013.01); *H01J 27/04* (2013.01); *H01J 37/3056* (2013.01); *H01J 2237/061* (2013.01); *H01J 2237/0815* (2013.01)

(58) Field of Classification Search
CPC ......... H01J 27/00; H01J 27/04; H01J 27/024; H01J 27/026
USPC ........ 250/396 ML, 396 R, 423 R, 423 F, 427, 250/424, 281, 282, 288
See application file for complete search history.

(56) References Cited

U.S. PATENT DOCUMENTS 3,610,985 A 10/1971 Fleming et al.
4,119,855 A 10/1978 Bernacki
(Continued)

OTHER PUBLICATIONS

Japanese Patent Office, Office Action, Japanese Patent Application No. 2013-503985, pp. 1-2; publisher Japanese Patent Office, Published Tokyo, Japan; copyright and mailing date Jan. 26, 2015; translation enclosed (22 pages).
(Continued)

*Primary Examiner* — Jack Berman
*Assistant Examiner* — Jason McCormack
(74) *Attorney, Agent, or Firm* — Metz Lewis Brodman Must O'Keefe LLC

(57) ABSTRACT

An ion source is disclosed which utilizes independently powered electrodes that are isolated with a series of insulators. The ion source comprises an anode electrode with a hollow interior, where the anode is disposed between a cathode and an anti-cathode. A magnet or electro-magnet imposes a magnetic field in an axial direction through the bore of the anode. Gas is introduced into the anode area at a controllable pressure. The ion source includes a first voltage differential between the anode and cathode for the production of plasma and a second voltage differential between the anode and the anti-cathode for extraction of ions from the plasma, forming an ion beam, which is preferably of a narrow diameter at low beam energy. In particular, the voltage differential between the anti-cathode and anode is adjusted to control the initial beam divergence of extracted ions. An optional focus electrode with an independent power supply further focuses the ion beam. A final electrode defines the output boundary of the ion source to provide un-perturbed drift of the ions into the vacuum chamber.

23 Claims, 4 Drawing Sheets

(51) Int. Cl.
H01J 27/04 (2006.01)
H01J 37/305 (2006.01)

(56) References Cited

U.S. PATENT DOCUMENTS

| | | | | |
|---|---|---|---|---|
| 4,122,347 | A | * | 10/1978 | Kovalsky et al. ......... 250/423 R |
| 4,149,055 | A | | 4/1979 | Seliger et al. |
| 4,272,682 | A | | 6/1981 | Swann |
| 4,344,019 | A | * | 8/1982 | Gavin et al. ............. 315/111.81 |
| 4,423,355 | A | | 12/1983 | Kageyama |
| 4,743,756 | A | | 5/1988 | Krivanek |
| 4,873,445 | A | * | 10/1989 | Le Jeune ................... 250/423 R |
| 4,980,556 | A | * | 12/1990 | O'Connor et al. ........ 250/423 R |
| 5,009,743 | A | | 4/1991 | Swann |
| 5,150,010 | A | | 9/1992 | Kageyama |
| 5,196,707 | A | | 3/1993 | Gesley |
| 5,818,342 | A | * | 10/1998 | Solomon et al. ......... 340/815.46 |
| 5,922,179 | A | | 7/1999 | Mitro et al. |
| 6,236,054 | B1 | | 5/2001 | Barna et al. |
| 6,346,768 | B1 | | 2/2002 | Proudfoot |
| 6,352,626 | B1 | | 3/2002 | von Zweck |
| 6,583,544 | B1 | | 6/2003 | Horsky et al. |
| 6,639,223 | B2 | | 10/2003 | Reyes |
| 6,710,338 | B2 | | 3/2004 | Gerlach et al. |
| 6,768,110 | B2 | | 7/2004 | Alani |
| 6,777,882 | B2 | | 8/2004 | Goldberg et al. |
| 6,914,244 | B2 | | 7/2005 | Alani |
| 7,609,003 | B2 | * | 10/2009 | Horsky et al. ............ 315/111.81 |
| 2003/0234369 | A1 | * | 12/2003 | Glukhoy .................... 250/423 R |
| 2004/0000651 | A1 | * | 1/2004 | Horsky et al. ............ 250/492.21 |
| 2005/0173651 | A1 | | 8/2005 | Goldberg |
| 2006/0022148 | A1 | | 2/2006 | Fischione |
| 2006/0284105 | A1 | * | 12/2006 | Yamashita et al. ............ 250/426 |
| 2007/0023701 | A1 | | 2/2007 | Fischione et al. |
| 2007/0170372 | A1 | * | 7/2007 | Horsky .......................... 250/427 |
| 2007/0278417 | A1 | * | 12/2007 | Horsky et al. .................. 250/427 |
| 2008/0048127 | A1 | * | 2/2008 | Murphy et al. ............ 250/423 R |
| 2008/0067412 | A1 | * | 3/2008 | Vanderberg et al. .......... 250/427 |
| 2008/0129180 | A1 | | 6/2008 | Murrell et al. .................. 313/337 |
| 2008/0277593 | A1 | * | 11/2008 | Fujita et al. ............... 250/423 R |
| 2009/0212232 | A1 | * | 8/2009 | Yamashita et al. ........ 250/423 R |
| 2009/0236547 | A1 | * | 9/2009 | Huang et al. .............. 250/492.21 |

OTHER PUBLICATIONS

European Patent Office, Supplementary European Search Report, European Patent Application No. 11766813.7-1566/2561540; pp. 1-7; publisher European Patent Office; Published Munich, Germany; copyright and mailing date May 9, 2014; (7 pages).

* cited by examiner

ION SOURCE WITH INDEPENDENT POWER SUPPLIES

BACKGROUND OF THE INVENTION

1. Field of the Invention

This invention relates to an ion source for the production of an ion beam from gaseous species. More specifically, the ion source utilizes a plurality of electrically isolated electrodes exposed to a DC-type plasma, to sustain the plasma and to extract ions from the plasma in a way suitable for subsequent beam transport and focusing at variable energy.

2. Description of the Prior Art

Ion beams are commonly used for many purposes, among them material surface modification (implantation), doping of semiconductors, formation of compounds by epitaxy, surface analysis, sputter-etching and the like. For some applications, such as preparation of inorganic specimens for electron microscopy, it is desirable that the ion beams used be formed from noble gas species, such as argon, so as to minimize chemical interactions between the atoms of the beam and those of the specimen. Such noble-gas ion beams may still produce desired changes to a specimen by virtue of momentum transfer. It is generally further desirable to contain or otherwise control the beam diameter to reduce unwanted impingement of the beam on materials other than the specimen.

Ions that impinge on the surface of a specimen with sufficient momentum are capable of ejecting atoms of the specimen from its surface; this process is known as sputtering. The efficiency of the sputtering process depends on the incident ion's mass and kinetic energy, the specimen material, and the geometric parameters of the collision. Atoms that are sputtered from a specimen will eventually collide again with a surface, and could be adsorbed after the collision. It is possible that a sputtered atom could return to a site on the original specimen, near its original location before sputtering. This occurrence is known as "re-deposition." For some applications, such as specimen preparation for electron microscopy, re-deposition is undesirable because it alters the original structure of the specimen. Hence, in some situations it is desirable to use an ion beam with a diameter no larger than the area intended to be sputtered, to minimize the likelihood that material from surrounding areas will be re-deposited onto the area of interest. There are many other well-known situations in which it is desirable to use an ion beam of small or limited diameter. In other applications, a wide beam is preferred for maximum coverage and milling of the specimen surface.

Various approaches have been tried for production of noble-gas ion beams capable of being focused into small diameter spots. These include gas-field ion sources, duoplasmatrons, electron-bombardment ion sources, Penning ion sources, multi-cusp ion sources, electron-cyclotron resonance ion sources, and others as described in the literature. Each type has advantages and disadvantages in terms of output beam parameters, size, complexity, power requirements and cost, among other criteria.

For certain applications in specimen preparation for electron microscopy, the Penning-type ion source is a reasonable choice because of its small size and simplicity of construction. A class of commercial devices in this field, known as ion mills, typically provide ion beams with adjustable ion kinetic energy (known commonly as "energy") in the range of approximately 500 eV (per ion) to 10,000 eV. Higher-energy beams provide faster milling, but may leave more residual surface damage, than lower-energy beams. So, it is useful to provide an adjustable energy beam, allowing the user to determine, on a case by case basis, the trade-off between processing speed and surface quality.

Penning-type ion sources use the principle of electromagnetic confinement to force electrons to make multiple passes through an ionizing region, known as a cavity, thereby increasing the likelihood of ionizing collisions between the energetic electrons and gas molecules in the cavity. More specifically, a magnetic field is used to constrain the motion of electrons to an axis along the length of the cavity, and electrostatic mirrors are placed at opposite ends of the cavity so that electrons generally cycle back and forth between the mirrors and along the magnetic axis. The electrostatic potential of the cavity is made higher than that of the mirrors by an electrode called the anode. So, electrons in the vicinity of the mirrors are attracted towards the cavity and acquire kinetic energy on their way into the cavity. The electrons oscillate between the mirrors and through the cavity until they collide with other particles, notably gas molecules introduced into the cavity. Some of these collisions result in the ionization of neutral gas molecules, resulting in additional free electrons and also ions. Ions formed in the cavity are attracted toward one mirror electrode or the other and on impact with a mirror electrode, can liberate additional "secondary" electrons, which again are attracted to the anode. The result is a self-sustaining chain reaction, which produces a plasma in the cavity. By convention, because the mirror electrodes function to introduce electrons, they are also identified as cathodes. In some embodiments one of the cathodes is heated to provide additional electrons to the plasma by thermionic emission, and sometimes the non-heated cathode is identified as an anti-cathode to emphasize the relative importance of the heated cathode for electron production.

The plasma is a gas with a high density of charged particles (ions and electrons), but approximately equal numbers of both polarities of charges, so that it has minimal net charge, i.e. minimal space charge. Because of the large number of free charged particles, the effective electrical conductivity within the plasma is high; i.e. the interior of the plasma is at an approximately uniform electrical potential. It is well known that this electrical potential, known as the plasma potential, is close to that of the anode. Between the interior of the plasma and any adjacent cathode, there is a region of relatively high electric field strength, known as a sheath.

Ions within the plasma are affected by diffusion processes, resulting in a net flux of ions exiting the boundaries of the plasma. This net flux out of the plasma offsets the ion generation process, resulting in an equilibrium concentration of ions within the plasma. Some of the diffusing ions collide with the anode and are neutralized, and others diffuse toward a sheath. When ions diffuse into a sheath they are accelerated quickly towards the adjacent cathode because of the strong electrostatic field in the sheath. Ions and electrons are quickly swept across a sheath by its high electric field; therefore, the density of charges within a sheath is relatively low.

In order to form a useful beam, ions must be extracted from the plasma in which they are produced. Generally, a hole is added to an electrode, so that ions that would normally impinge on the electrode in the area of the hole instead continue their motion through the hole and out of the source, where they can be used. Some embodiments provide a hole in the anode, while others provide a hole in a cathode. Generally, extraction through a cathode has advantages in terms of current density, as opposed to extraction through the anode. Ions extracted through a cathode exit the cathode with kinetic energy approximately equal to the difference in electrostatic potential between the plasma and the cathode, times the charge state of the ion. Adding a hole to a cathode for extraction reduces its ability to provide electrons to sustain the plasma. For this reason, and for purpose of specificity, in the instant disclosure, the cathode through which ions are extracted is identified as the anti-cathode, and the opposite minor electrode is identified as the cathode.

In general, the intended target of an ion beam is often located remotely from the ion source. This distance may range from a few millimeters to hundreds of millimeters or more. It is common in the field for the specimen, or workpiece, to be held at ground potential, along with the bulk of the vacuum chamber through which the ions pass. To prevent distortion of the beam in the region between the source and the specimen, it is usually desirable to minimize electrostatic fields in this region. This is often accomplished by adding a grounded electrode at the exit of the ion source.

FIG. 1 is a diagram of a typical prior art Penning-type ion source. Penning ion source 2 includes ring magnet 4, which creates an axial magnetic field in its interior region. Cathode 6 and anti-cathode 8 are made of metal with a high magnetic permeability and act as pole-pieces to shape the magnetic field. Cathode 6 and anti-cathode 8 are in electrical contact with magnet 4, which is also electrically conductive. Cathode 6 is attached to insulating base 5, which is mounted on vacuum flange 7, which in turn is mounted to a vacuum chamber (not shown). The vacuum chamber is connected to earth potential and so flange 7 is also at earth potential. Anode 10 is ring-shaped and supported by circumferentially disposed insulator(s) 12, thus anode 10 is electrically isolated from the other system components. Anode 10 is connected to a power supply (not shown), biased positive at nominal ion beam potential with respect to the vacuum chamber, through electrical feed-through 14, which passes through cathode passage 13 and through insulating base 5. Ion beam potential is defined as the desired kinetic energy per ion outside the source, divided by its nominal charge state. Cathode 6 is connected to a second power supply (not shown) through electrical feed-through 18, which biases cathode 6, magnet 4 and anti-cathode 8 negatively with respect to anode 10. Gas is supplied through inlet tube 22, flows through the ion source 2, and is pumped out of the source into the vacuum chamber (not shown) through aperture 24 in flange 7, thereby maintaining a gas pressure inside anode 10 that is favorable for sustaining a Penning discharge. A plasma is formed in the interior area of anode 10; the plasma potential is approximately the same as that of anode 10. Some ions from the plasma are directed towards anti-cathode 8 due to the electric field within the plasma sheath in the vicinity of anti-cathode 8, and some of these ions drift through anti-cathode passage 9 and are extracted to the right. Ions attain their final energy once they pass through aperture 24, which is at ground potential.

One of skill in the art will appreciate the fact that the beam divergence in the vicinity of the anti-cathode (i.e., in the area of initial extraction from the plasma), is affected by the shape of the plasma boundary and the shape of the anti-cathode electrode. The shape of the plasma boundary is affected by many factors, among them the pressure of gas inside the anode volume, the discharge power, the potential difference across the plasma sheath, and the shapes of the electrodes. Further, for a given geometry and gas pressure, a certain minimum potential difference is required between the anode and mirror electrodes to sustain a plasma discharge. Typically this minimum potential difference is on the order of 700V. In the prior art Penning ion source 2, this potential difference appears across the plasma sheath in the vicinity of anti-cathode 8, thereby affecting the divergence of the extracted beam.

Therefore, the requirements for generating ions through plasma discharge impose restrictions on the beam divergence at the point of extraction.

A divergent beam can be made more parallel by using an electrostatic lens. In Penning ion source 2, the space between anti-cathode 8 and aperture 24, in general, constitutes a lens, since under most operating conditions there is a potential difference between anti-cathode 8 and aperture 24. The strength of this lens varies in proportion to the potential difference between anti-cathode 8 and aperture 24, so that as the anode potential is raised to high values, e.g., 5000V, the lens becomes fairly strong and corrects for the high initial divergence of the beam. However, at lower anode potentials, the strength of this lens becomes progressively weaker, so that the initial beam divergence cannot be fully corrected by the lens-effect between anti-cathode 8 and aperture 24, and the spot size on the specimen increases.

It will be apparent to those skilled in the art that one could place an additional lens or lenses between anti-cathode 8 and aperture 24, or to the right of aperture 24. This is not desirable as it adds to the mechanical size and complexity of the system, requires a separate power supply, and introduces new aberration factors into the beam path. Further, its power supply may be required to generate impractically high voltages, perhaps substantially greater than that of the anode power supply, to provide sufficient focusing.

For the reasons articulated above, the production of a parallel or nearly parallel ion beam over a wide energy range with the prior art Penning ion source 2 is not practical. For ion milling, this means that a Penning ion source, which is optimized for spot size at one energy level, will generally suffer increased spot size when operating at other energy levels. Hence, re-deposition of sputtered material onto an area of interest is likely when operating at energies away from the design point.

As will be apparent to those skilled in the art, the use of lower energy ions would minimize specimen damage. However, the ability to create a small, focused beam at low energy has not been resolved.

What is lacking in the art, therefore, is an ion source with the ability to thin a specimen to electron transparency with a low energy ion beam having a relatively small beam diameter.

SUMMARY OF THE INVENTION

The present invention discloses an ion source which utilizes independently powered electrodes isolated with a series of insulators. The ion source is particularly useful in the preparation of specimens for electron microscopy, since its beam can maintain a generally constant diameter over a wide operating range of energy, typically 6 keV to 100 eV. More particularly, and dependent upon the specific implementation, the energy range may encompass narrower ranges, such as from 6 keV to 1000 eV or 300 eV. Moreover, the source is capable of generating parallel ion beams having low energy and a small spot size. Alternatively, as dictated by the application, the beam may be defocused and widened to provide maximum coverage and milling of the specimen surface. In one embodiment, inert gas, including the noble gasses, is introduced into the ion source where it is subjected to a combination of magnetic and electric fields, thereby producing a plasma. Ions from the produced plasma are extracted through an anti-cathode, which is biased negatively with respect to an anode in contact with the plasma. Another electrode, the cathode, is disposed opposite the anti-cathode and maintained at a sufficient negative electrical bias with respect to the anode, independent of the anti-cathode, to sustain the plasma discharge. The initial divergence of the extracted ion beam is controlled by adjusting the bias voltage of the anti-cathode with respect to the anode. Optionally, the extracted ion beam passes through a focus electrode with an independent power supply. A final electrode at vacuum chamber potential defines the electrostatic output boundary of the ion source.

Preferably, the electrical isolation of the cathode and anti-cathode voltage biases allows for the creation of a high voltage differential between the anode and cathode sufficient for the production of plasma and a lower voltage differential between the anode and the anticathode to diminish any lens effects in the anti-cathode plasma sheath and minimize initial divergence of the extracted beam. The strength of the downstream lens is further controlled by varying the potential on the focus electrode. By varying the potentials on the anti-cathode and focus electrode as a function of the anode's potential (with respect to the vacuum chamber), the ion source produces a low-divergence ion beam at all energy levels within its operating range, thus minimizing specimen damage by re-deposition during ion milling.

These and other advantages and features of the present invention will be more fully understood with reference to the presently preferred embodiments thereof and to the appended drawings.

DESCRIPTION OF THE PREFERRED EMBODIMENTS

Figure 2:
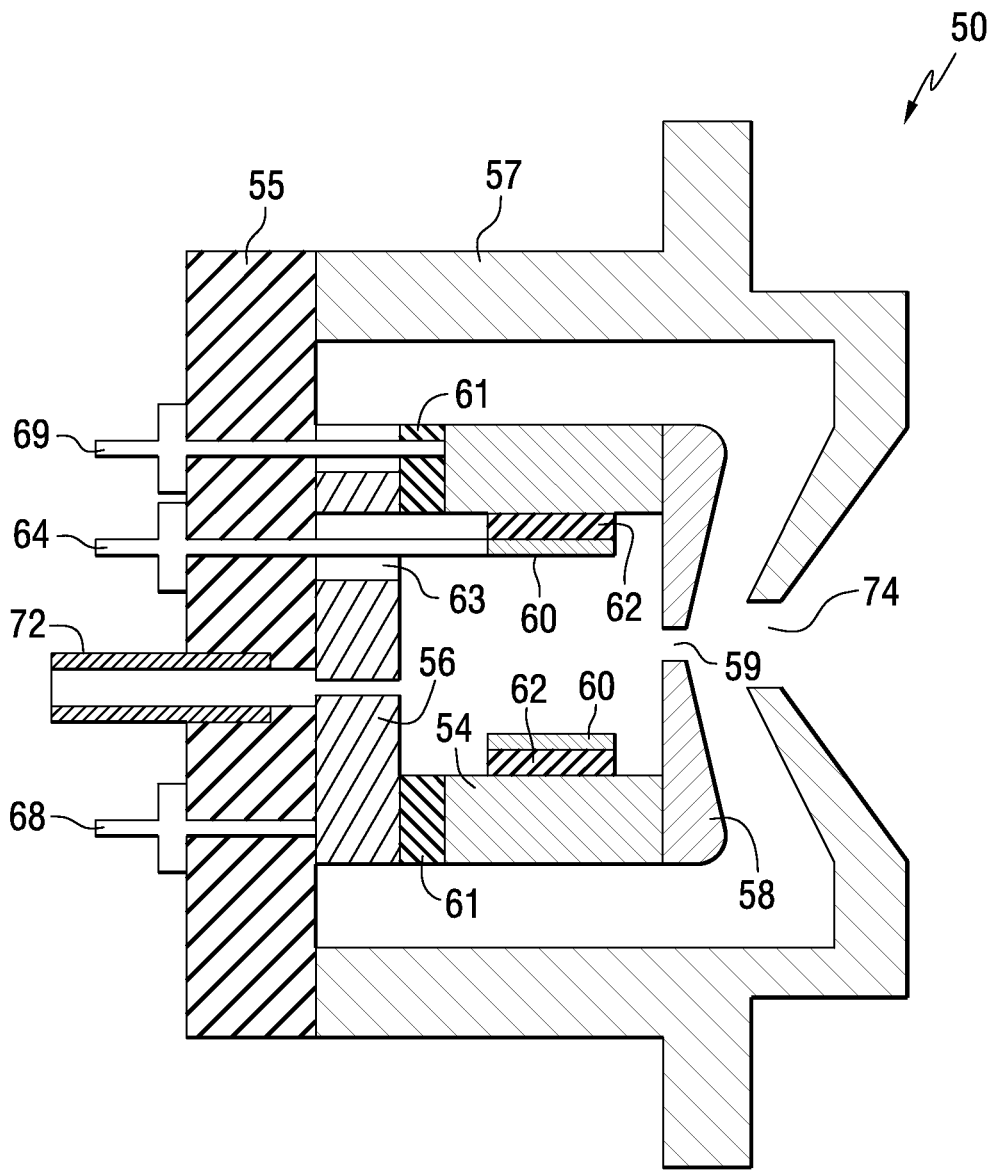
FIG. 2 is a side sectional view of one embodiment of the ion source of the invention.
Figure 2A:
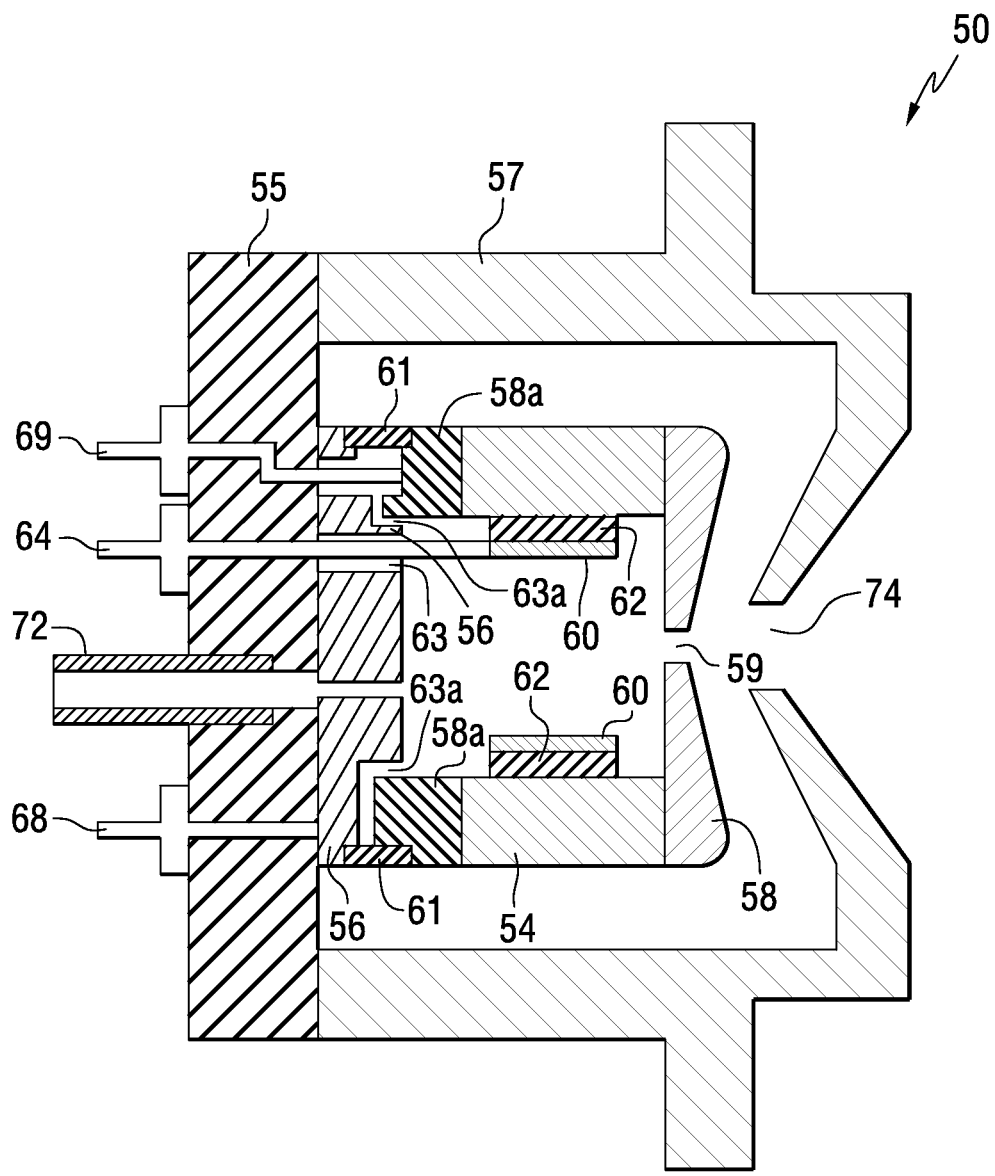
FIG. 2A is a side sectional view of a second embodiment of the ion source of the invention.

Referring now to FIGS. 2 and 2A, ion source 50 includes ring magnet 54, which is magnetized with the poles oriented to the flat faces, and which creates an axial magnetic field in its interior region. Cathode 56 and anti-cathode 58 are constructed of metal with a high magnetic permeability and act as pole-pieces to shape the magnetic field, such as 400-series stainless steel, or Iron-Nickel alloys such as Kovar. Cathode 56 is attached to insulating base 55, which is mounted on vacuum flange 57, which in turn is mounted to a vacuum chamber (not shown). Vacuum flange 57 provides mechanical support for ion source 50, as well as a vacuum envelope in its interior for the management of suitable operating pressure in conjunction with the vacuum chamber to which it is attached. Typically vacuum flange 57 is constructed of stainless steel or aluminum, or any other metal of low magnetic permeability and which is suitable for use in vacuum systems. Low magnetic permeability is desired for vacuum flange 57 so as not to perturb the magnetic field in the vicinity of anode 60. Insulating base 55 provides mechanical support for, and electrical feed through to, anode 60, cathode 56 and anticathode 58. Cathode 56 comprises a metal with high magnetic permeability and a secondary electron yield coefficient. In a preferred embodiment, cathode 56 shows resistance to ion sputtering of the intended species at energies approaching 1 keV. Dependent upon the application and the selected target voltage, the geometry and spacing of the electrode shapes and spacing may require some adjustment. Current is dictated by selected voltage and plasma conditions, electrode shape and spacing as well as gas pressure.

Anti-cathode 58 is in electrical contact with magnet 54, which is also electrically conductive. Insulator 61 is ring-shaped and is disposed between cathode 56 and ring magnet 54, isolating them electrically. It is preferred that insulator 61 be of small thickness in the axial direction so as to minimize its contribution to the length of gap in the magnetic circuit. The vacuum chamber is connected to earth potential and so vacuum flange 57 is also at earth potential. Anode 60 is ring-shaped and supported by circumferentially disposed insulators 62, thus anode 60 is electrically isolated from the other system components. The embodiment shown in FIG. 2 exposes the insulators 61, 62 directly to the plasma. In some conditions, it may be desirable to shield the insulators to reduce degradation from such exposure. Specific designs of such shielding are considered within the ambit of one skilled in the art. Generally, it is preferable to create a nonlinear path to the insulator from the plasma. Referring now to FIG. 2A, a specific example of such an embodiment is illustrated. An anti-cathode extension 58a is located on the opposite side of the magnet 54 from the anti-cathode 58. All three components are in electronic communication and are therefore at the same potential, as supplied by feed through 69. Insulator 61 separates anti-cathode extension 58a, magnet 54 and anti-cathode 58 from cathode 56. Insulator 61 is also located at the termination of a circuitous path 63a which shields insulator 61 from direct impingement of the plasma. This shielding is intended to prolong the useful life of the insulators. While not illustrated, it is specifically contemplated that similar shielding may be applied to insulator 62 which separates anode 60 from magnet 54. Anode 60 is preferably constructed of a metal with low magnetic permeability, so as not to perturb the shape of the magnetic field within its interior. Anode 60 is connected to a power supply (not shown), biased positively at nominal ion beam potential with respect to the vacuum chamber, through electrical feed-through 64, which passes through cathode passage 63 and through insulating base 55. Cathode 56 is connected to a second power supply (not shown) through electrical feed-through 68, biasing cathode 56 negatively with respect to anode 10. Typically the bias voltage is in the range of −500V to −1000V. Magnet 54 and anti-cathode 58 are connected to a third power supply (not shown) through electrical feed-through 69, biasing magnet 54 and anti-cathode 58 negatively with respect to anode 60. As a result, cathode 56 and anticathode 58 show a separation of voltage bias. Preferably, the third power supply should be adjustable over the range of −100V to −1000V. Gas is supplied through inlet tube 72 and flows through the ion source 50 and is pumped out of the source into the vacuum chamber (not shown) through aperture 74 in flange 57, thereby maintaining a gas pressure inside anode 60 that is favorable for sustaining a discharge. Typically the gas supply will be adjusted to a flow rate in the range of 0.1 to 2.0 standard cubic centimeters per minute, with a target rate of 0.2 standard cubic centimeters per minute. It is to be specifically noted that the best rate depends on other factors, including the gas and electrode geometry. Preferred gas sources include inert gasses such as argon, or other species including reactive gasses, depending on the intended purpose of the ion beam. A plasma is formed in the interior area of anode 60; the plasma potential is approximately the same as that of anode 60. Some ions from the plasma are directed towards anti-cathode 58 due to the electric field within the plasma sheath in the vicinity of anti-cathode 58 and some of these ions drift through anti-cathode passage 59 and are extracted to the right. Ions attain their final energy once they pass through aperture 74, which is at ground potential. Beam energies of particularly low power, from 100 eV to 6 keV, are achievable with beam diameters of 350 microns to 5 mm. More particularly, under certain operating conditions and applications, at 100 eV a narrow beam diameter of approximately 1.0 mm is achievable. However, under defocused conditions, as will be described below, a beam diameter of up to 5 mm is possible.

Figure 1:
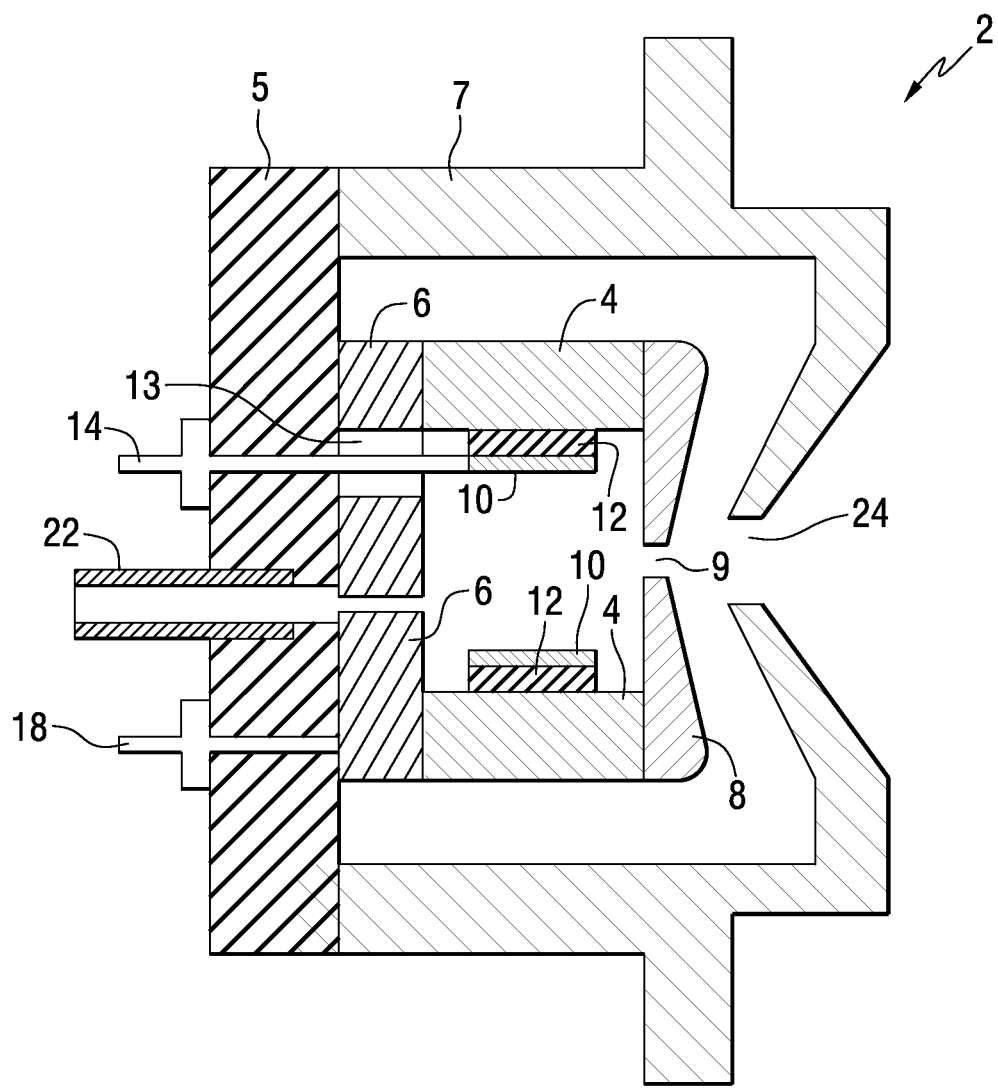
FIG. 1 is a side sectional view of a prior art ion source.
Figure 3:
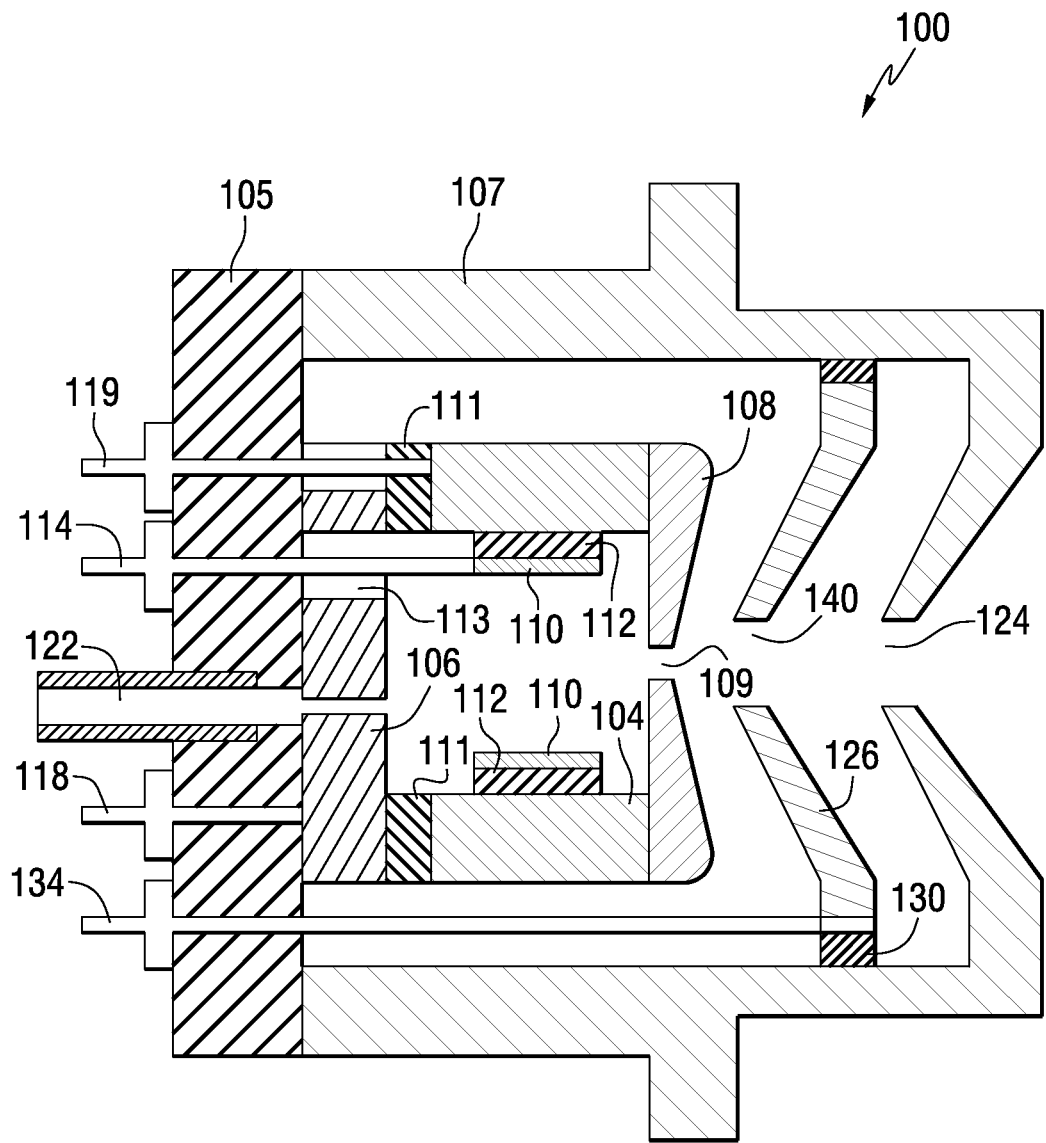
FIG. 3 is a side sectional view of a third embodiment of the ion source of the invention.

FIG. 3 illustrates an alternative embodiment of the ion source. Ring magnet 104, cathode 106, anti-cathode 108, anode 110, insulating base 105, and insulators 111 and 112 are all disposed and electrically connected similarly as described above regarding FIGS. 1 and 2. Anode 110 is supplied with current by feed through pin 114, cathode 107 by pin 118, and magnet 104 and anti-cathode 108 by pin 119. Focus electrode 126 is disposed in the axial space between anti-cathode 108 and vacuum flange 107, and is supported by electrical insulator 130. Focus electrode 126 is connected to a fourth electrical power supply (not shown) by feed-through pin 134, which passes through insulating base 105. Gas is provided through tube 122 so as to establish a favorable pressure for plasma production in the interior of anode 110. It is to be specifically understood that the preferred and all other embodiments of the ion source are intended to be utilized with one or more process gases which are introduced to and utilized by the ion source in a manner consistent with the prior art and within the ambit of one of ordinary skill in this art. Ions encountering the plasma sheath in the vicinity of anti-cathode 108, are extracted through aperture 109. The electrical potential on anti-cathode 108 is adjusted with respect to anode 110 potential, so as to improve the beam profile of the initially-extracted ion beam. Further, the potential on focus electrode 126 is adjusted by controlling said fourth power supply, so that additional focusing of the extracted ion beam can be achieved in the gap between apertures 109 and 140, and in the gap between apertures 140 and 124. Operating voltage ranges are, as identified previously, highly dependent upon application, but the voltage for focus electrode 126 is typically 0 to ⅓ of the magnitude of the desired beam energy (but in the negative polarity). For example, in a narrow beam application, such as might be utilized in conjunction with the preparation of TEM specimens, at 1 keV, the focus electrode's voltage is within the range of −2 kV to −1 kV, creating a selectable beam diameter of 350 microns to 1 mm. Alternatively, in a wide beam application, such as the preparation of SEM specimens, at 1 keV, the voltage is within the range of −500V to 0V creating a selectable beam diameter of 1-5 mm. Aperture 124 is at ground potential and defines an electrostatic boundary between the ion source 100 and the rest of the vacuum chamber to which it is attached.

One of skill in the art will appreciate that operating anti-cathode 108 at a different electrical potential than cathode 106 will result in a reduction of the efficiency of the electro-optical minor arrangement in the Penning discharge, increasing the difficulty of sustaining a plasma. Therefore, the potential difference between anti-cathode 108 and anode 110 cannot be arbitrarily reduced for the purpose of optimizing the extracted beam profile, but should be adjusted to establish a compromise between the strength of the plasma discharge and the quality of the extracted ion beam. Focus electrode 126 permits further correction of the angular divergence of the extracted beam, after such compromise is made in the adjustment of potential on anti-cathode 108.

The present invention has certain advantages over prior art ion sources. The present ion source 100 allows for the independent control of the voltage of anti-cathode 108. As a result, a large voltage differential may exist between anode 110 and cathode 106 for plasma production. In addition, a smaller voltage differential may exist between anode 110 and anti-cathode 108 to provide for an improvement in the extracted beam profile. An additional advantage is that the potential on focus electrode 126 may be varied independently of the beam energy. Unlike the prior art Penning source, the strength of the lens created between anti-cathode 108 and focus electrode 126 is no longer strictly constrained by the beam-energy setting (as is the case in the FIG. 2 embodiment between anti-cathode 58 and output aperture 74), but rather in part by varying voltage on focus electrode 126. The independent electrical supplies to anode 110, cathode 106 and anti-cathode 108 provide for an ion source 100, which allows for improved ion beam focusing over a wide range of beam energies, including both narrowly and widely focused beams for different applications.

While independent control of the potential on focus electrode 126 alone would allow for arbitrary focusing of the beam across the energy range, keeping the anti-cathode 108 at the same potential as cathode 106, would require impractically high voltages on the focus electrode 126 to accomplish proper correction of the initial angular divergence. For example, the required voltage magnitude on focus electrode 126 could be several times the potential applied to anode 110. By adjusting the potential of anti-cathode 108 relative to anode 110 to mitigate initial beam divergence, a weaker subsequent lens can be used, thereby allowing for the use of lower control voltages on focus electrode 126.

The use of independent power supplies for anode 110, cathode 106, anti-cathode 108 and focus electrode 126, allows for the production of a small diameter ion beam at variable energy. This low energy, concentrated ion beam minimizes damage during the preparation of electron microscopy specimens. It should be specifically noted, however, that the independent power supplies may provide different operational voltages, each may be divided or derived from a common power source by a resistive voltage-divider or transistor circuit.

Finally, two preferred embodiments of the invention have been described hereinabove and those of ordinary skill in the art will recognize that these embodiments may be modified and altered without departing from the central spirit and scope of the invention. Thus, the embodiments described hereinabove are to be considered in all respects as illustrative and not restrictive. The scope of the invention being indicated by the appended claims rather than the foregoing descriptions and all changes which come within the meaning and range of equivalency of the claims are intended to be embraced herein.

What is claimed is:

1. An ion source comprising:
   an anode, having a hollow interior region extending axially therethrough along a longitudinal axis;
   a magnet producing a magnetic field generally axially aligned with said hollow interior region of said anode;
   a cathode disposed along one end of said longitudinal axis, said cathode biased electrically negatively with respect to said anode; and
   an anti-cathode having a first aperture, disposed along and coaxially aligned with a second end of said longitudinal axis, opposite said cathode with respect to said anode, said anti-cathode being separately and independently biased electrically negatively with respect to said anode and said cathode;
   said anode, cathode and anticathode forming a. chamber, including said hollow interior region of said anode, for the creation and constraint by contact with a plasma formed of charged ion particles;

an electrode having a second aperture, disposed along and coaxially aligned with said second end of said longitudinal axis exterior to said anti-cathode, said electrode being separately and independently biased electrically negatively with respect to said anode, said cathode and said anti-cathode; and said magnetic field and said bias of said cathode, anticathode and electrode, causing said charged ion particles to form a focused beam along said longitudinal axis which passes through said first and second apertures.

2. The ion source of claim 1, further comprising a source of gas in fluid communication with said hollow interior region.

3. The ion source of claim 2, wherein said gas is selected from the group consisting of inert gasses and reactive gasses.

4. The ion source of claim 3, wherein said gas is argon.

5. The ion source of claim 1 wherein said magnet is selected from the group consisting of permanent and electromagnets.

6. The ion source of claim 2, wherein said gas is flowed into said hollow interior region at a rate between 0.1 to 2.0 standard cubic centimeters per minute.

7. The ion source of claim 6, wherein said gas is flowed into said hollow interior region at a rate of 0.2 standard cubic centimeters per minute.

8. The ion source of claim 1, wherein said focused beam of charged ion particles has an energy level within the range of 100 eV to 6 keV.

9. The ion source of claim 1, wherein said beam energy is continuously user-adjustable.

10. The ion source of claim 1, Wherein at least one of said cathode and anti-cathode are constructed of metal with a magnetic permeability.

11. The ion source of claim 1, wherein said anti-cathode and said magnet are at the same electrical potential.

12. The ion source of claim 11, further comprising at least one insulator separating said anti-cathode and said magnet from: (i) said cathode and (ii) said anode.

13. The ion source of claim 12, wherein said at least one insulator is at least partially shielded from plasma generated within said ion source.

14. The ion source of claim 1 wherein at least one of said cathode and said anti-cathode is constructed from a ferromagnetic material.

15. The ion source of claim 1, wherein said cathode is electrically biased with respect to said anode, said bias voltage being within the range of −500 to −1000 V.

16. The ion source of claim 1, wherein said anti-cathode is electrically biased with respect to said anode, said bias voltage being within the range of −100 to −1000 V.

17. The ion source of claim 1, Wherein said focused beam of charged ion particles has an energy level within the range of 6 keV to 100 eV.

18. The ion source of claim 17, wherein said electrode has an applied voltage selected within the range of 0 to ⅓ of the magnitude of said beam energy.

19. The ion source of claim 1, wherein said focused beam of charged ion particles has a diameter between 350 microns to 5 mm.

20. The ion source of claim 17, wherein said focused beam has an energy level of about 100 eV and a beam diameter of about 1.0 mm.

21. The ion source of claim 17, wherein said focused beam has an energy level of about 1 keV and a beam diameter between 2-5 mm.

22. The ion source of claim 1, wherein said cathode and said anti-cathode are selectively biased separately from each other and said anode.

23. The ion source of claim 1, further comprising an insulator separating at least two of said magnet, cathode, anticathode and anode;
   said at least two of said magnet, cathode, anticathode and anode being sized and shaped to form an exclusively nonlinear path between said chamber and said insulator,
   said exclusively nonlinear path shielding said insulator from direct impingement from said plasma.

* * * * *